(12) United States Patent
Welland et al.

(10) Patent No.: US 8,421,529 B2
(45) Date of Patent: Apr. 16, 2013

(54) METHOD AND APPARATUS FOR REDUCING INTERFERENCE

(75) Inventors: David R. Welland, Austin, TX (US); Donald A. Kerth, Austin, TX (US); Caiyi Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/650,543

(22) Filed: Dec. 31, 2009

(65) Prior Publication Data

US 2010/0102858 A1   Apr. 29, 2010

Related U.S. Application Data

(60) Continuation of application No. 11/170,386, filed on Jun. 29, 2005, now abandoned, which is a division of application No. 09/686,072, filed on Oct. 11, 2000, now abandoned.

(51) Int. Cl.
*H03K 5/00*   (2006.01)

(52) U.S. Cl.
USPC ............................................. 327/551; 327/552

(58) Field of Classification Search ........... 327/551–559
See application file for complete search history.

(56) References Cited

U.S. PATENT DOCUMENTS

| 6,088,253 | A  | * | 7/2000  | Shimizu ......................... 365/51 |
| 6,275,101 | B1 | * | 8/2001  | Underhill ...................... 327/551 |
| 6,977,605 | B2 | * | 12/2005 | Lee et al. ...................... 341/161 |

* cited by examiner

*Primary Examiner* — Dinh T. Le
(74) *Attorney, Agent, or Firm* — Law Offices of Maximilian R. Peterson

(57) ABSTRACT

A method and apparatus is provided for reducing interference in circuits. A management strategy is provided to reduce reference spurs and interference in circuits. The management strategy uses a combination of one or more techniques which reduce the digital current, minimize mutual inductance, utilize field cancellation, prevent leakage current, and/or manage impedance. These techniques may be used alone, or preferably, used on combination with one another.

20 Claims, 7 Drawing Sheets

METHOD AND APPARATUS FOR REDUCING INTERFERENCE

CROSS REFERENCE TO RELATED APPLICATIONS

This application is a continuation of U.S. patent application Ser. No. 11/170,386, filed on Jun. 29, 2005 now abandoned, entitled "METHOD AND APPARATUS FOR REDUCING INTERFERENCE," which is a divisional of U.S. patent application Ser. No. 09/686,072, filed on Oct. 11, 2000 now abandoned, entitled "METHOD AND APPARATUS FOR REDUCING INTERFERENCE," which applications are incorporated by reference herein.

FIELD OF THE INVENTION

This invention relates generally to interference in circuits. In particular, this invention relates to a method and apparatus for reducing reference spurs and interference in a circuit such as a frequency synthesizer that may be implemented on a single integrated circuit (IC).

BACKGROUND OF THE INVENTION

In various types of circuits, interference causes problems with the operation of the circuits. In some circuits, the purity of signals in the circuit can significantly effect the performance of the circuits. For example, in a wireless communications system, the performance of the system may be dependent on the purity of synthesized output signals. Interference can therefore cause problems with the operation of the system.

Wireless communication systems typically require frequency synthesis in both the receive path circuitry and the transmit path circuitry. For example, cellular phone standards in the United States and Europe define cellular telephone systems with communication centered in two frequency bands, at about 900 MHz and 1800 MHz. For example, United States cellular phone standards include (1) the AMPS (analog), IS-54 (analog/digital), and IS-95 (analog/digital) standards in the 900 MHz frequency band, and (2) PCS (digital) standards in the 1800 MHz range. European cellular phone standards include (1) the TACS (analog) and GSM (digital) standards in the 900 MHz frequency band, and (2) the DCS1800 (digital) standard in the 1800 MHz range. A dual band cellular phone is capable of operating in both the 900 MHz frequency band and the 1800 MHz frequency band.

Within the frequency bands, the cellular standards define systems in which base station units and mobile units communicate through multiple channels, such as 30 kHz (IS-54) or 200 kHz (GSM) wide channels. For example, with the IS-54 standard, approximately 800 channels are used for transmitting information from the base station to the mobile unit, and another approximately 800 channels are used for transmitting information from the mobile unit to the base station. A frequency band of 869 MHz-894 MHz and a frequency band of 824 MHz-849 MHz are reserved for these channels, respectively. Because the mobile unit must be capable of transmitting and receiving on any of the channels for the standard within which it is operating, a frequency synthesizer must be provided to create accurate frequency signals in increments of the particular channel widths, such as for example 30 kHz increments in the 800-900 MHz region.

Phase-locked loop (PLL) circuits including voltage controlled oscillators (VCOs) are often used in mobile unit applications to produce the desired output frequency ($f_{OUT}$). The output frequency may be made programmable by utilizing an output frequency feedback divider (÷N) and a reference divider (÷R) for an input reference frequency ($f_{REF}$). The output frequency produced is a function of the values selected for "N" and "R" in the divider circuits, such that $f_{OUT}$=N ($f_{REF}$/R). The PLL circuitry typically utilizes a phase detector to monitor phase differences (Δθ) between the divided reference frequency ($f_{REF}$/R) and the divided output frequency ($f_{OUT}$/N) to drive a charge pump. The charge pump delivers packets of charge proportional to the phase difference (Δθ) to a loop filter. The loop filter outputs a voltage that is connected to the VCO to control its output frequency. The action of this feedback loop attempts to drive the phase difference (Δθ) to zero (or at least to a constant value) to provide a stable and programmable output frequency.

The values for the reference frequency and the divider circuits may be chosen depending upon the standard under which the mobile unit is operating. For example, within the United States IS-54 system, a PLL could be built such that $f_{REF}$/R=30 kHz and such that N is on the order of 30,000. The output frequency, therefore, could then be set in 30 kHz increments to frequencies in the 900 MHz frequency band. Similarly, within the European GSM system, a PLL could be built such that $f_{REF}$/R=200 kHz and such that N is on the order of 4,500. The output frequency, therefore, could then be set in 200 kHz increments to frequencies in the 900 MHz frequency band.

As mentioned above, the performance of the communication system, however, is critically dependent on the purity of the synthesized high-frequency output signals. For signal reception, impure frequency sources result in mixing of undesired channels into the desired channel signal. For signal transmission, impure frequency sources create interference in neighboring channels. A frequency synthesizer, therefore, must typically meet very stringent requirements for spectral purity. The level of spectral purity required in cellular telephone applications makes the design of a PLL synthesizer solution and, in particular, the design of a VCO within a PLL synthesizer solution quite demanding.

Three types of spectral impurity will typically occur in VCO circuits that are used in PLL implementations for frequency synthesis: harmonic distortion terms associated with the output frequency, spurious tones near the output frequency, and phase noise centered on the output frequency. Generally, harmonic distortion terms are not too troublesome because they occur far from the desired fundamental and their effects may be eliminated in cellular phone circuitry external to the frequency synthesizer. Spurious tones, however, often fall close to the fundamental. In particular, spurious tones at frequencies of ±$f_{REF}$/R and multiples thereof from the output frequency ($f_{OUT}$) are often found in the output frequency spectrum. These are called reference tones or reference spurs. Spurious tones, including reference spurs, may be required by a cellular phone application to be less than about −70 dBc, while harmonic distortion terms may only be required to be less than about −20 dBc. It is noted that the "c" indicates the quantity as measured relative to the power of the "carrier" frequency, which is the output frequency.

Phase noise is undesired energy spread continuously in the vicinity of the output frequency, invariably possessing a higher power density at frequencies closer to the fundamental of the output frequency. Phase noise is often expressed as dBc/√Hz or dBc/Hz. Because of the effect phase noise has on system performance, a typical cellular application might require the frequency synthesizer to produce an output frequency having phase noise of less than about −110 dBc/√Hz at 100 kHz from the output frequency.

Because the phase noise specifications are so stringent in cellular phone applications, the VCOs used in cellular phone PLL synthesizer solutions are typically based on some resonant structure. Ceramic resonators and LC tank circuits are common examples. While details in the implementation of LC tank oscillators differ, the general resonant structure includes an inductor (L) connected in parallel with a fixed capacitor (C) and a variable capacitor ($C_X$). In the absence of any losses, energy would slosh between the capacitors and the inductor at a frequency $f_{OUT}=(1/2\pi)[L(C+C_X)]^{-1/2}$. Because energy will be dissipated in any real oscillator, power in the form of a negative conductance source, such as an amplifier, is applied to sustain the oscillation. It is often the case that the series resistance of the inductor is the dominant loss mechanism in an LC tank oscillator, although other losses typically exist.

While it is highly desirable to integrate the VCO with the other components of the PLL onto a single integrated circuit for cost, size, power dissipation, and performance considerations, barriers to integration exist. One significant problem relates to the spurious tones mentioned above. When a VCO is integrated with the other components of the PLL, the digital circuitry in the PLL circuit (such as the N and R divider circuits) interferes with the operation of the VCO, resulting in spurs. One cause of this interference is the current through the digital circuitry which induces current into the VCO circuitry, causing the spurs. In short, although integration onto a single integrated circuit of a PLL implementation for synthesizing high-frequency signals is desirable for a commercial cellular phone application, integration is difficult.

The example mentioned above relates to interference which may effect the operation of a VCO or similar circuit. Problems with interference also exist in other situations. For example, in situations where a desired signal has a low voltage level, interference can cause problems, even where no resonant circuit is involved. It is therefore a desire to reduce interference in a wide range of applications and circuit types, in addition to those described above.

SUMMARY OF THE INVENTION

An apparatus and method of the invention is provided for reducing spurious tones present in a circuit. One embodiment of the invention provides a method of integrating a VCO and a PLL for a wireless communication system onto a single integrated circuit including the steps of forming an integrated circuit having both the PLL and the VCO integrated on the integrated circuit and applying one or more techniques to reduce the effects of spurious tones present near the frequency of the output of the VCO. One technique includes providing fixed divider circuitry for the PLL. Another technique includes reducing the mutual inductance between digital circuitry in the PLL and the VCO by placing a filter between digital circuitry in the PLL and a voltage source external to the integrated circuit in order to reduce the area of a high frequency current loop. Another technique includes identifying a conductive trace on the integrated circuit having a relatively long length and placing a conductive strip in the proximity of the identified conductive trace to help contain high frequency current flowing through the conductive trace within a current loop having a minimal area. Another technique includes forming at least some similar circuit elements on the integrated circuit such that adjacent circuit elements are mirror images of one another. Another technique includes providing a first block of digital circuitry connected to a second block of digital circuitry by a signal line, and inserting buffer circuitry between the first and second blocks of digital circuitry for containing high frequency current within the first block of digital circuitry. Another technique includes identifying circuitry in the integrated circuit in which the impedance of the circuitry changes over time during operation of the integrated circuit, and creating replica circuitry of the identified circuitry which operates in a phase opposite of the identified circuitry. Another technique includes the use of a filter coupled to the input of an integrated circuit.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which similar references indicate similar elements and in which.

DETAILED DESCRIPTION

The present invention contemplates a method and apparatus for reducing reference spurs and interference in a circuit. One application of the present invention contemplates a method and apparatus for synthesizing high-frequency signals by implementing a phase-locked loop (PLL) frequency synthesizer, including a voltage controlled oscillator, on a single integrated circuit (IC). In particular, the invention uses techniques to reduce spurious noise in the output signal of the VCO induced by the PLL digital circuitry. Note, however, that many of the techniques of present invention may also be applicable to any other type of circuit where interference is a problem.

Figure 1:
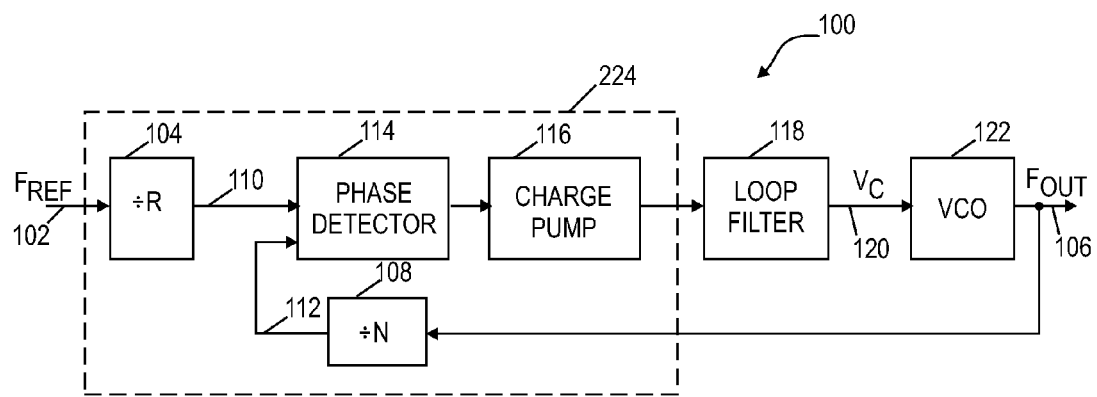
FIG. 1 is a block diagram of phase locked loop (PLL) circuitry for synthesizing frequencies for a wireless communications device.

FIG. 1 is a block diagram of phase-locked loop (PLL) circuitry 100 for synthesizing frequencies required, for example, by a wireless communications device. The reference frequency ($f_{REF}$) 102 is received by a divide-by-R (÷R) counter 104, and the output frequency ($f_{OUT}$) 106 is received by a divide-by-N (÷N) counter 108. The resulting divided signals 110 and 112 are received by a phase detector 114. The phase detector 114 determines the phase difference ($\Delta\theta$) between the phase of the divided signal 110 and the phase of the divided signal 112. The phase detector 114 uses this phase difference ($\Delta\theta$) to drive a charge pump 116. The charge pump 116 provides an output that is filtered by a loop filter 118 to provide a voltage control ($V_C$) signal 120. The $V_C$ signal 120 controls the output frequency ($f_{OUT}$) 106 of a voltage controlled oscillator (VCO) 122. The values for N and R may be selected to provide a desired output frequency such that $f_{OUT}=N(f_{REF}/R)$.

As discussed above, it is desirable for the PLL circuitry 100 to be integrated onto a single chip. For example, the dotted line 224 depicted in FIG. 1 represents the portions of the PLL circuitry 100 that have been integrated into a single integrated circuit in some prior art circuitry. The present invention, however, provides a frequency synthesis solution that is capable of full integration.

As mentioned above, when a VCO is integrated with the other components of a PLL, the digital circuitry in the PLL circuit may interfere with the operation of the VCO, resulting in spurs. When a frequency synthesizer attempts to tune to a frequency near a spur, problems result. One cause of this interference is the current through the digital circuitry which induces current into the VCO circuitry, causing the spurs. Since the edges of digital signals are so sharp, the harmonics of the interfering signals are significant, even in the Gigahertz range. Following is a description of this mechanism as a cause of digital noise.

Figure 2:
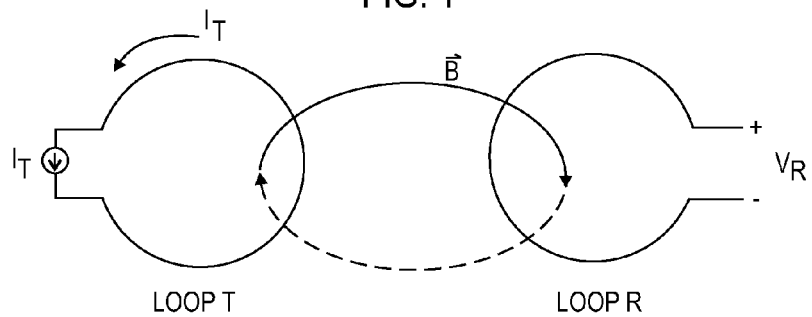
FIG. 2 is a diagram showing a transmit loop and a receive loop to illustrate the cause of digital interference.

FIG. 2 is a diagram illustrating a transmit loop T and a receive loop R which will be used to illustrate a source of digital interference. The transmit loop T is comprised of one of many current loops present in digital circuitry. The transmit loop T is shown with a current source $I_T$ to illustrate the source of current $I_T$ flowing through the transmit loop T. The receive loop R may be comprised of a loop in other portions of a device, for example, in a VCO. The receive loop R includes an output voltage $V_R$. The loops R and T have a mutual inductance M which has a value based on the geometries of the loops R and T. As the current $I_T$ flows through the transmit loop T, a magnetic field B is created which induces a current onto the receive loop R. This induced current in loop R is the source of voltage $V_R$. The value of the voltage $V_R$ can be calculated as follows. The flux $\emptyset_R$ through the receive loop R is expressed as:

$$\emptyset_R = \int \vec{B} \cdot d\vec{a} = MI_T \qquad (1).$$

Therefore, the voltage $V_R$ can be expressed as $$V_R = \frac{d\emptyset_R}{dt} = M\frac{dI_T}{dt}. \qquad (2)$$

It can be seen by these equations that the voltage $V_R$ is determined by the value of the mutual inductance M, and by the derivative of the current $I_T$. As discussed below, the present invention utilizes various techniques to reduce spurs by either minimizing the mutual inductance M of the transmit and receive loops, or by reducing the current $I_T$.

Figure 3:
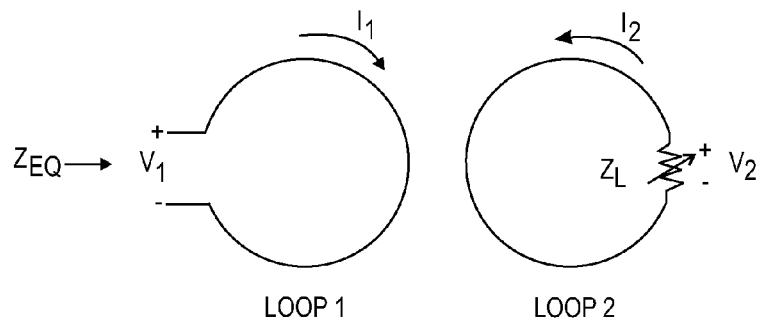
FIG. 3 is a diagram showing first and second loops to illustrate the effect on the impedance of the first loop to a change in the impedance in the second loop.

FIG. 3 is a diagram showing a first loop 1 and a second loop 2 to illustrate the effect on the impedance $Z_{EQ}$ of loop 1 of a change in the impedance $Z_L$ in loop 2. Loops 1 and 2 represent current loops formed in various places in a circuit. For example, the loop 1 may be formed in a VCO, while loop 2 is formed in digital circuitry (described below). Following is a description illustrating how the impedance $Z_{EQ}$ of loop 1 can be effected by a change in the impedance $Z_L$ of loop 2. Following are equations for the impedances $Z_{EQ}$ and $Z_L$:

$$Z_{EQ} = \frac{V_1}{I_1}; \text{ and} \qquad (3)$$

$$Z_L = -\frac{V_2}{I_2}. \qquad (4)$$

Note the sign given the conventions.

The flux $\emptyset_1$ and $\emptyset_2$ of the loops 1 and 2 can be represented by the following equations:

$$\emptyset_1 = L_1 I_1 + MI_2 \qquad (5); \text{ and}$$

$$\emptyset_2 = L_2 I_2 + MI_1 \qquad (6).$$

Using the notation "s" for $$\frac{d}{dt},$$

the voltages $V_1$ and $V_2$ can be expressed as:

$$V_1 = s\emptyset_1 = sL_1 I_1 + sMI_2 \qquad (7); \text{ and}$$

$$V_2 = s\emptyset_2 = sL_2 I_2 + sMI_1 \qquad (8).$$

Substituting the value of $V_2$ from equation (4) into equation (8) gives the following equation:

$$-I_2 Z_L = sL_2 I_2 + sMI_1 \qquad (9).$$

Solving for $I_2$, gives:

$$I_2 = -\frac{sM}{Z_L + sL_2} I_1. \qquad (10)$$

Substituting this value of $I_2$ into equation (7) results in:

$$V_1 = sL_1 I_1 - \frac{s^2 M^2}{Z_L + sL_2} I_1 = \left[sL_1 - \frac{s^2 M^2}{Z_L + sL_2}\right] I_1. \qquad (11)$$

Substituting this value of $V_1$ into equation (1) results in:

$$Z_{EQ} = sL_1 - \frac{s^2 M^2}{Z_L + sL_2}. \qquad (12)$$

It can be seen by equation (12) that a change in $Z_L$ in loop 2 effects the value of $Z_{EQ}$ in loop 1 as does a change in the self inductance $L_2$ or the mutual inductance M (as for example, a result of a change in geometry). Loop 1 may represent the inductance of the LC circuit. The impedance $Z_{EQ}$, then, is presented to the capacitor of the LC circuit. Therefore, the oscillation frequency is affected by a change in $Z_{EQ}$. If the impedance $Z_L$ varies periodically with time and a change in $Z_L$ effects the value of $Z_{EQ}$, the oscillation frequency varies with time (frequency modulation). As is well known in the art, low level periodic frequency modulation results in spurs in an oscillator output spectrum. Note that the magnitude of the spurs depends on the magnitude of the frequency modulation and the speed of the frequency modulation. For example, a square-wave frequency deviation of +/−1.0 kHz with a period of 5.0 usec results in spurs +/−200 kHz from the carrier having an amplitude of −49.9 dBc.

It is also evident that capacitive coupling between an oscillator and other circuitry that exhibits a changing impedance could also change the frequency of oscillation. As discussed below, the present invention utilizes various techniques to reduce spurs by minimizing the amount that $Z_{EQ}$ changes during operation of the circuit.

The present invention uses a spur management strategy to reduce the amplitude of the spurs. This strategy can best be understood by looking at the causes (described above) of the interference between the PLL digital circuitry and the VCO. The management strategy uses a combination of one or more techniques which reduce the digital current, minimize mutual inductance, utilize field cancellation, prevent leakage current, and/or manage impedance. All of these techniques are described in detail below. Note that any one of the techniques may be used alone, or preferably, used in combination with one another.

The first technique attempts to reduce the digital current that causes spurs. Looking at the PLL circuitry 100 shown in FIG. 1, a major source of digital current that causes interference is the divide-by-R counter 104. In a typical prior art PLL, such as that shown in FIG. 1, the divide-by-R counter is implemented using a synchronous programmable counter. Synchronous programmable counters are readily designed and can easily be programmed to divide by a desired amount. One problem with synchronous programmable counters is that the counter will have a large number of components. Another problem with synchronous programmable counters is that every flip-flop in the counter is clocked at the same speed. The present invention reduces the digital current by reducing the number of components in the divide-by-R counter. This is accomplished by replacing the programmable counter by one or more fixed-value counters and clocking at least one of the counters at a slower rate.

Figure 4:
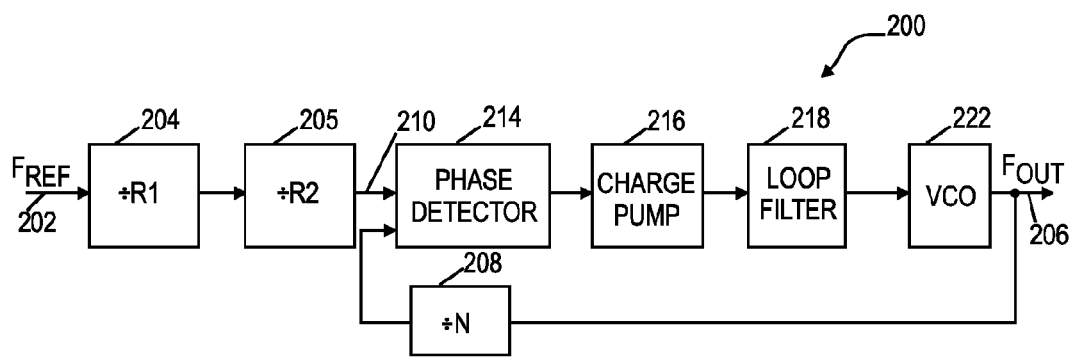
FIG. 4 is a block diagram of an embodiment of phase locked loop (PLL) circuitry of the present invention.

FIG. 4 is a block diagram of PLL circuitry 200 which is similar to the PLL circuitry 100 except that the programmable divide-by-R counter is replaced with two fixed-value counters 204 and 205. FIG. 4 will be described in the example where the reference frequency ($f_{REF}$) 202 is 13 MHz and where the desired divided signal 210 is 200 kHz. This example corresponds to the desired frequency for the GSM standard. In this example, the desired value of R is 65 (since 13 MHz÷65=200 KHz). FIG. 4 shows a first divide-by-R1 counter 204 and a second divide-by-R2 counter 205. To divide by 65, R1 is given a value of 5 and R2 is given a value of 13, resulting in a total division of 65. This arrangement results in less digital current since the components of the counter 205 are clocked at $f_{REF}$/R1 rather than at $f_{REF}$. In addition, less support logic is required in a fixed counter versus a universally programmable counter. Of course, the counters 204 and 205 could be reversed. In some applications, the counters 204 and 205 could be replaced by more than two counters, so long as the desired division is accomplished. Similarly, any other digital circuitry that is found to cause spurs may be modified to reduce the digital current.

Note that FIG. 4 shows only one example of how the digital current can be reduced. In another embodiment, the digital circuitry that comprises the divide-by counter(s) can be powered by a lower voltage than the remainder of the PLL circuitry. This will reduce the digital current in CMOS applications. In another embodiment, the adverse effect of the digital circuitry can be reduced by rounding the corners of the digital pulses generated by the counters. This will reduce the amplitude of the harmonic components of the digital current.

The next technique described attempts to reduce spurs by reducing the mutual inductance between current loops in the digital circuitry in the PLL and current loops in the VCO. As is well known, the mutual inductance is dependent on the area of the transmit and receive loops. The present invention uses supply filters to reduce the area of these loops. Note that in the prior art, filters may be used to maintain a voltage supply, but not to reduce the area of a current loop.

In digital circuitry (such as the digital circuitry comprising divide-by counters 204 and 205), a transmit loop is formed through the digital circuitry back to a supply, such as the voltage source that supplies voltage to the digital circuitry. Since the voltage source is located off the IC, the transmit loop can be relatively large. The present invention uses a supply filter (e.g., a low pass filter) to shorten the current loop, thereby reducing the mutual inductance between the digital circuitry of the PLL and the VCO.

Figure 5:
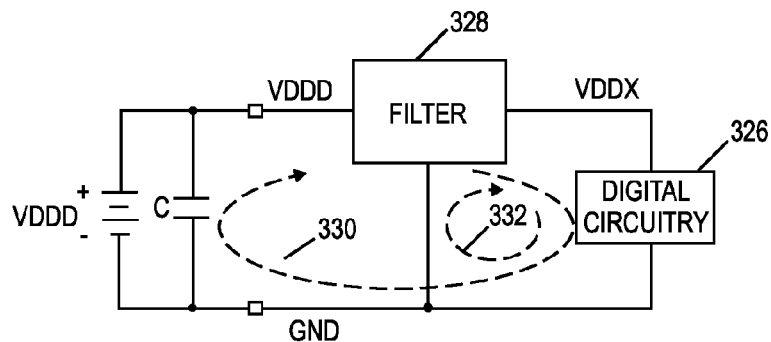
FIG. 5 is a block diagram of a supply filter of the present invention.

FIG. 5 is a block diagram showing digital circuitry 326 and a supply filter 328 connected to a source of voltage (VDDD) and ground (GND). The supply filter provides a source of voltage VDDX to the digital circuitry 326 which is also connected to ground GND. The purpose of the supply filter 328 is to shorten the current loop formed through the digital circuitry and its voltage supply, at least for frequency components near the output frequency of the VCO. To illustrate this, FIG. 5 illustrates two separate current loops. A first current loop 330 illustrates a current loop which flows through the digital circuitry 326 and through voltage supply circuitry (voltage source VDDD and bypass capacitor C) external to the IC. The area of the current loop 330 is relatively large by necessity of including off-chip components. A second current loop 332 illustrates a current loop which flows through the digital circuitry 326 and through the supply filter 328 which is formed on the IC. The area of the current loop 332 is small relative to the current loop 330.

Figure 6:
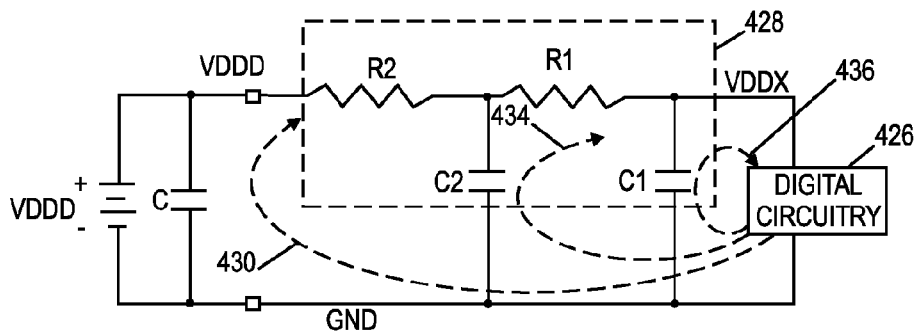
FIG. 6 is one embodiment of the supply filter shown in FIG. 5.

FIG. 6 is a schematic diagram illustrating one example of a supply filter 428 for use with digital circuitry 426. The supply filter 428 has a first section comprising capacitor C1 and resistor R1. The supply filter has a second section comprising capacitor C2 and resistor R2. The capacitor C1 is connected between voltage supply VDDX and ground GND. The resistors R1 and R2 are connected to each other between the voltage source VDDD and the digital circuitry 426. The capacitor C2 is connected between the node formed by resistors R1 and R2 and ground GND. If desired, the supply filter 328 could include more sections by adding additional capacitors and resistors connected in the same manner as the first two sections. In addition, the supply filter 328 shown in FIG. 5 could also be provided by active circuitry. The details of any digital circuitry will determine a desired number of sections and the desired values of the components. In one embodiment, the supply filter 428 includes two sections with capacitors and resistors having the following values (R1=134Ω; C1=81.0 pF; R2=134Ω; C2=13.5 pF).

The purpose of the supply filter 428 is to shorten the current loops for high frequency components of current, while allowing low frequency components to supply power to the digital circuitry 426. FIG. 6 illustrates three separate current loops.

Of course, if the filter 428 had more sections, there would be more current loops. A first current loop 430 illustrates a current loop which flows through the digital circuitry 426, through voltage supply circuitry (and bypass capacitor C), and through resistors R2 and R1. The area of the current loop 430 is relatively large by necessity of including off-chip components. A second current loop 434 illustrates a current loop which flows through the digital circuitry 426, through capacitor C2 and resistor R1, and back to the digital circuitry 426. The area of the current loop 434 is small relative to the current loop 430. A third current loop 436 illustrates a current loop which flows through the digital circuitry 426, through capacitor C1, and back to the digital circuitry 426. The area of the current loop 436 is also small relative to the current loop 430. To minimize the areas of loops 434 and 436, capacitors C1 and C1 should be placed as closed to the digital circuitry 426 as possible.

The supply filter 428 operates as follows. As mentioned above, the purpose of the supply filter 428 is to reduce the area of current loops for high frequency components of the current. In one embodiment, the first section of the supply filter 428 will cause approximately 90% of the high frequency components of the current to flow through current loop 436. Of the remaining 10% of the high frequency components of the current, approximately 90% will flow through the second current loop 434. As a result, only 1% of the high frequency components of the current will flow through the largest current loop 430. At the same time, DC current, and low frequency components of the current, will flow nearly uninhibited to the digital circuitry 426 from the external power supply. In this way, the net area of the high frequency current loop is reduced, reducing the mutual inductance at frequencies of interest, and thus reducing spurs.

The next technique described also attempts to reduce spurs by reducing the mutual inductance between current loops in the digital circuitry in the PLL and current loops in the VCO. The present invention uses conduits to reduce the area of the transmit loops by containing high frequency current flowing through a signal line which spans a large distance. This large distance may be 1 mm or more, for example.

Figure 7:
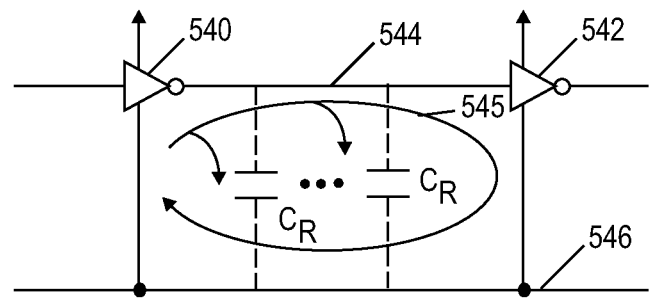
FIG. 7 is a schematic diagram illustrating a prior art circuit.
Figure 8:
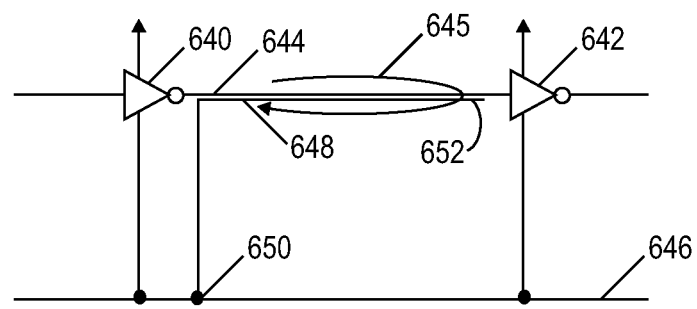
FIG. 8 is a schematic diagram illustrating a conductive strip used to shield a signal line.

FIG. 7 is a schematic diagram of two circuit elements (in this example, inverters 540 and 542) connected together by a signal line 544. For current flowing through the signal line 544 from driving inverter 540 to load inverter 542, a return path is provided by ground return 546. Note that the ground return 546 may include a conductive path as well as the entire substrate of the IC. FIG. 7 also shows a route capacitance $C_R$ formed by the signal line 544 and ground return 546 between the signal line 544 and the substrate or ground return 546. The route capacitance $C_R$ causes additional high frequency current to flow through the path formed by the route capacitance $C_R$. The current loop for the high frequency components of the current which defines the mutual inductance has an area dependent on the placement of the components 540 and 542, the signal line 544, and the ground return 546. FIG. 7 shows a route current loop 545 which flows through the route capacitance $C_R$, and therefore is distributed over a large area in the circuit. Note that the signal line 544 is capacitively coupled to the ground return 546 which includes the entire substrate in an IC. Also note that the schematic diagrams shown in FIGS. 7 and 8 are two-dimensional. In an actual IC, the entire substrate acts as a ground and current can flow back in three dimensions through a number of paths.

FIG. 8 is a schematic diagram of two similar circuit elements 640 and 642 connected together by a signal line 644. The technique of the present invention uses a conductive strip 648 connected at one end 650 to ground (i.e., a reference voltage). The opposite end 652 of the conductive strip 648 is not connected to ground. As a result, the conductive strip 648 acts as a shield to the signal line 644 and provides a return path for high frequency components of the current which flows along the signal line 644. The strip 648 increases the route capacitance, but manages the return path. As a result of the strip 648, the signal line 644 is no longer capacitively coupled to the ground return 646, but is capacitively coupled to the conductive strip 648. FIG. 8 shows a current loop 645 which flows through the route capacitance formed between the signal line 644 and strip 648. In other words, the loop area of the prior art (FIG. 7) includes the area between the signal line 544 and the ground return 546, while the loop area of the present invention (FIG. 8) includes the area between the signal line 644 and the conductive strip 648. It can be seen that the loop area is greatly reduced by the conductive strip 648. Note that the conductive strip 648 is most effective with the end 652 not connected to anything since if it were otherwise connected, some of the current could flow back through the ground return 646.

Figure 9:
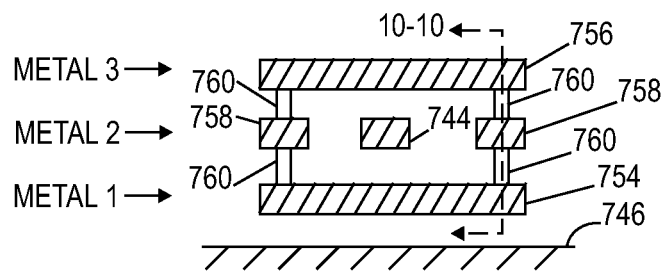
FIGS. 9-15 illustrate various embodiments of the conductive strip shown in FIG. 8.

FIGS. 9-15 illustrate many implementations of the conductive strip shown in FIG. 8 in an IC having a substrate and three metal layers. FIG. 9 is a sectional end view illustrating a silicon substrate 746 and three metal layers (METAL 1, METAL 2, METAL 3) of an IC. A signal line 744 is formed in the METAL 2 layer. A first conductive strip 754 is formed on the METAL 1 layer directly below the signal line 744. A second conductive strip 756 is formed on the METAL 3 layer directly above the signal line 744. Finally, conductive strips 758 are formed in the METAL 2 layer on each side of the signal line 744. The conductive strips 754, 756, and 758 are connected to each other by vias 760 and are grounded at one end (like conductive strip 648 is grounded at end 650). The opposite ends of the conductive strips 754, 756, and 758 are not connected to anything. As shown, the conductive strips 754, 756, and 758 surround the signal line 744 forming a conduit which shields the signal line 744 much like a coaxial cable is shielded. As mentioned above, the current loop area is greatly reduced by the conduit, reducing the mutual inductance of the loop to any other loop on the IC.

Figure 10:
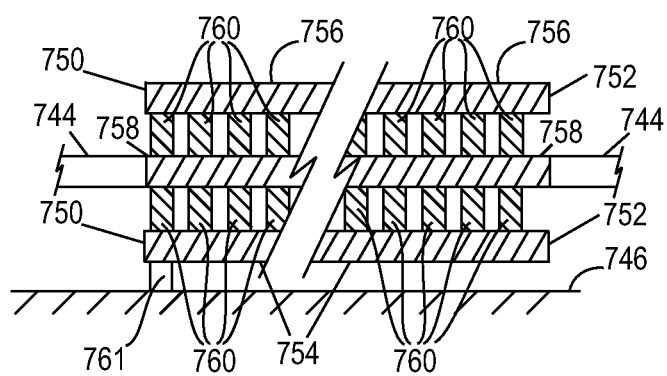

FIG. 10 is a sectional side view taken along line 10-10 of FIG. 9. FIG. 10 helps to illustrate how the conductive strips are connected or not at each end. FIG. 10 shows the conductive strips 754 and 756 connected to ground (the substrate 746) by contact 761 at one end 750. As shown, the opposite ends 752 are not connected to ground. The signal line 744 is shown extending past the ends 752 where it will be connected to a circuit component such as component 642 (FIG. 8).

Figure 11:
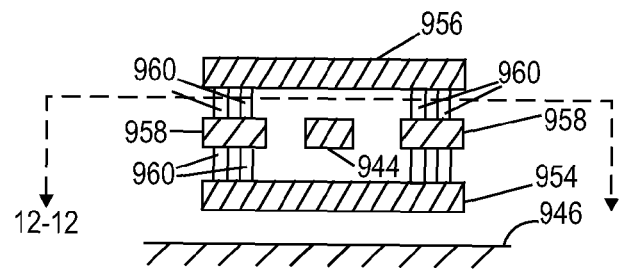
Figure 12:
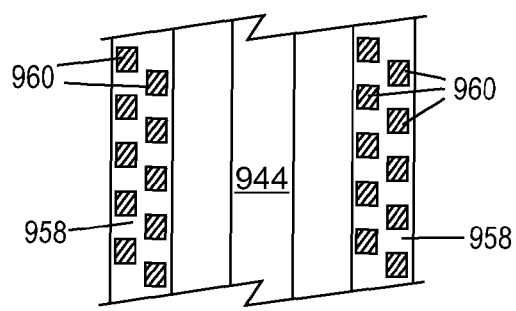

FIGS. 11-15 illustrate alternate forms of the conduits of the present invention. FIG. 11 is a sectional end view similar to FIG. 9. However, the conduit shown in FIG. 11 includes two rows of vias 960 connecting the conductive strips 954, 956, and 958. The embodiment shown in FIG. 11 more completely shields the signal line 944. FIG. 12 is a top sectional view taken along line 12-12 in FIG. 11 showing the signal line 944 and the conductive strips 958. FIG. 12 also shows the layout of the vias 960. As shown, the vias 960 are arranged in separate staggered rows forming a "fence" or checkerboard type of pattern. This layout of vias 960 provides more shielding in the gaps between the conductive strips. Note that vias could be staggered in other ways.

Figure 13:
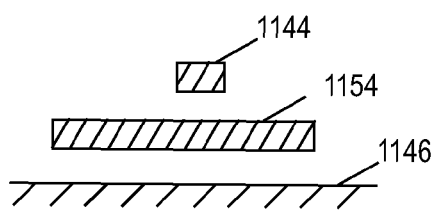
Figure 14:
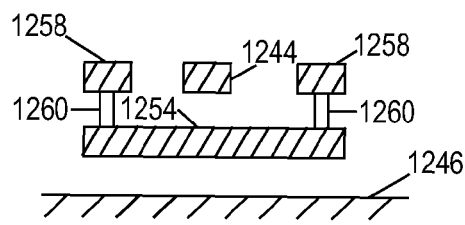

FIG. 13 shows an embodiment with only one conductive strip 1154 positioned between the signal line 1144 and the substrate 1146. The conductive strip 1154 is the same as the conductive strip 754 shown in FIG. 9, but without vias or other conductive strips. FIG. 14 shows an embodiment that provides better shielding that the embodiment shown in FIG.

Figure 15:
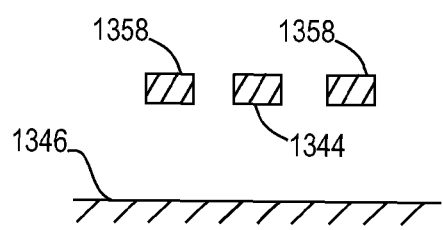

13. The embodiment shown in FIG. 14 allows a signal to be routed in the METAL 3 layer, while providing shielding of the signal line 1244 by the combination of conductive strips 1254, 1258, and vias 1260. FIG. 15 shows an embodiment with two conductive strips 1358 positioned on opposite sides of the signal line 1344. The conductive strips 1358 are the same as the conductive strips 758 shown in FIG. 9, but without vias connected to other conductive strips. The embodiments shown in FIGS. 13-15 will help to shield the signal lines 1144, 1244, and 1344 but not as thoroughly as the embodiment shown in FIGS. 9-11. It can be seen that many different combinations of conductive strips and metal layers may be used to implement the conduits of the present invention.

Another approach attempts to reduce spurs using a cancellation technique. For this technique, components of the PLL circuitry are arranged such that fields of certain components cancel the fields of other similar components. In other words, where a certain component may induce a current in the VCO, a similar component is arranged to induce an opposite current in the VCO.

Figure 16:
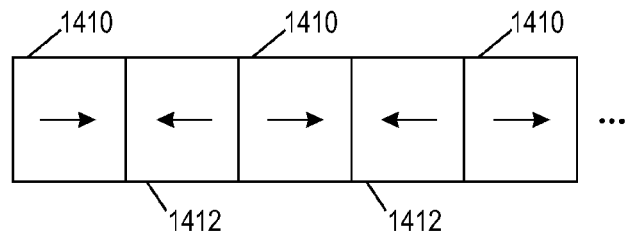
FIG. 16 is a diagram illustrating the layout of circuit components in one embodiment of the present invention.

In one embodiment, the flip-flops of the divide-by-R counter (104, 204, 205 in FIGS. 1 and 4) are arranged with every other flip-flop having an opposite sense of current flow. In other words, every circuit component is a minor image of the one next to it. FIG. 16 is a diagram illustrating such an arrangement. FIG. 16 shows a plurality of circuit components 1410 and 1412. Each of the circuit components in FIG. 16 is shown with an arrow to distinguish components having opposite senses of current flow. In the example layout shown in FIG. 16, the components 1410 are minor images of components 1412. By arranging these components in this way, the fields generated by the components 1410 cancel the fields generated by the components 1412.

The next technique described addresses the problem of spurs caused by changes in impedance during the operation of a circuit. A change in impedance in a circuit occurs in portions of a circuit that change over time (see equation (12) above). For example, a flip-flop can change states (e.g., goes from high to low or low to high) during the operation of a circuit. When a flip-flop changes states, certain switching devices in the flip-flop are switched on or off. The switches that are turned on provide paths that define the geometry of various loops which, in turn, effects the inductance of the loops as well as the mutual inductance between loops. As was described above with respect to FIG. 3, the frequency of oscillation of a VCO in the vicinity of a flip-flop will then vary with time, which results in spurs in the oscillator output spectrum.

The present invention alleviates the problem described above by isolating portions of the digital circuitry that cause the spurs as a result of changing impedance and cancels the changing impedance by adding replica circuitry which operates in an opposite phase. The portions of the digital circuitry which are more likely to cause spurs include circuitry where a signal line runs over a relatively long route, because the mutual inductance M will have a large value for a larger route. In the example of an inverter, a replica inverter is created and is controlled to always be in the opposite phase as the original inverter. In this way, the impedance looking into the inverters is approximately constant independent of the state of the inverters because when one inverter is high, the other inverter will be low, and vise versa. The original and replica inverters and their routes should be matched and placed as close together as possible.

Figure 17:
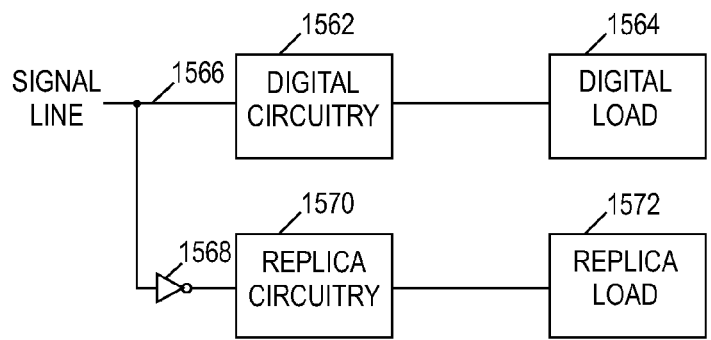
FIG. 17 is a block diagram of original and replica circuitry of the present invention.

FIG. 17 is a block diagram illustrating how replica circuitry can be implemented. FIG. 17 shows digital circuitry 1562 connected to a digital load 1564. A signal line 1566 is connected to the input of the digital circuitry 1562. As mentioned above, during operation, the digital circuitry 1562 will change states which can change the frequency of oscillation of a neighboring VCO. The signal line 1566 is also connected to an inverter 1568 so that the output of the inverter 1568 will always be high when the signal line 1566 is low, and vise versa. The output of the inverter 1568 is connected to replica circuitry 1570 which is connected to a replica load 1572. The replica circuitry 1570 and load 1572 are replicas of the digital circuitry 1562 and load 1564. By "replica", it should be understood that there may be some variations in the circuitry, but preferably, replica circuitry is designed to be as similar as possible and located as close as possible to the original circuitry. It is intended that when the digital circuitry 1562 is in one state, the replica circuitry 1570 is in the opposite state, thereby creating a substantially constant impedance environment as seen by the neighboring VCO.

Figure 18:
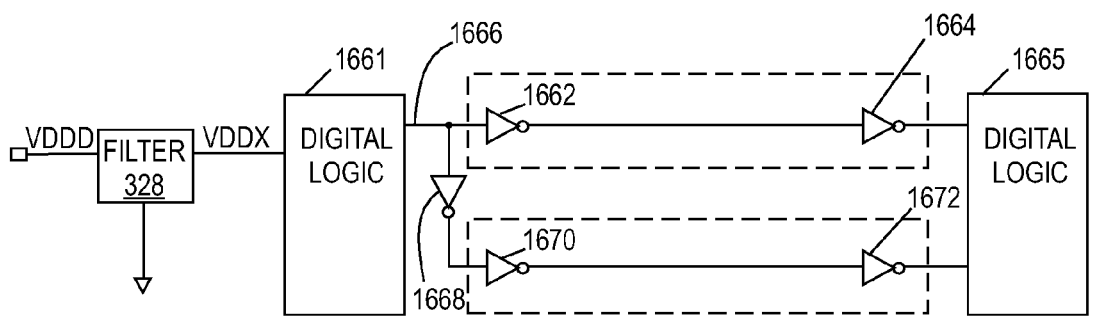
FIG. 18 is a schematic diagram of original and replica circuitry of the present invention.

FIG. 18 is a diagram illustrating an example where the digital circuitry is comprised of an inverter 1662 and the load is comprised of another inverter 1664. FIG. 18 shows digital logic circuitry 1661 and 1665 to illustrate how the original inverter 1662 and replica inverter 1670 may fit with other digital circuitry on an IC. A signal line 1666 is connected between the digital logic 1661 and the original inverter 1662. The signal line 1666 is also connected to an inverter 1668 which creates an inverted control signal for the replica inverter 1670. Therefore, when the output of the inverter 1662 is high, the output of the replica inverter 1670 will be low, and vise versa. The inverter 1662 is connected to a digital load (inverter 1664). The replica inverter 1670 is connected to a replica digital load (inverter 1672). Note that the replica circuitry serves no purpose in the function of the IC other than to reduce spurs by maintaining a constant impedance environment as seen by the neighboring VCO. FIG. 18 also shows a supply filter 328 connected to the digital logic 1661 for providing a voltage VDDX to the digital logic 1661. The filter 328 helps to reduce the mutual inductance M of uncanceled circuitry by minimization of loop area (in this case, the loop area of loop 2 (FIG. 3), rather than the loop area of loop T (FIG. 2)). Note therefore that the filter 328 shown in FIG. 18 provides this benefit in addition to the benefits described with respect to FIGS. 5 and 6.

Note that if other techniques for reducing spurs are used with digital circuitry which is replicated, the replicated circuitry should apply the same techniques. For example, if a conduit (described above) is used on the connection between the inverters 1662 and 1664, then a conduit should be used between the replica inverters 1670 and 1672. Rather than using the inverter 1668, separate control signals could be generated and used to control the circuitry, so long as the control signals keep the circuitry in opposite phases. Note that while the above discussion concentrates on magnetic coupling between loops, capacitively coupled impedance pulling is also canceled by the replicated circuitry.

The next spur reduction technique described is a way of reducing the mutual inductance between transmit and receive loops by containing leakage current in order to minimize the area of current loops. This technique is most applicable to situations where a block of dynamic digital circuitry receives a static control signal and/or sends a static status signal from/to another block of digital circuitry on the IC. As is described in more detail below, high frequency current can "leak" out from otherwise well-managed dynamic circuitry through the control or status lines, creating a large loop area.

Figure 19:
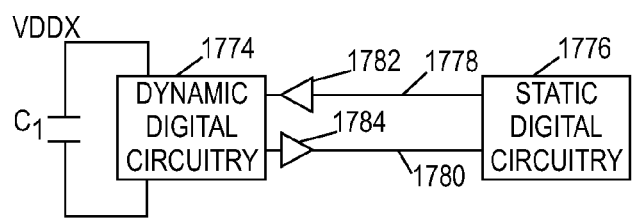
FIG. 19 is a block diagram showing the use of buffers of the present invention to contain leakage current.

FIG. 19 is a block diagram showing a block of dynamic digital circuitry 1774 and a block of static digital circuitry 1776 connected together by a control line 1778 and a status line 1780. To prevent current from leaking out over the control and status lines 1778 and 1780, buffers 1782 and 1784 are placed on the control line 1778 and status line 1780, respectively. As is explained in detail below, the buffers 1782 and 1784 confine the leakage current within the digital circuitry 1774 and the buffers 1782 and 1784. It is desired to position the buffers 1782 and 1784 on or as close to the periphery of the dynamic digital circuitry 1774 as possible.

Figure 20:
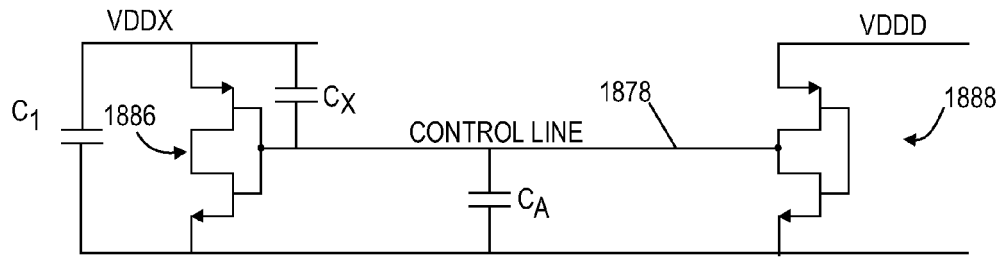
FIGS. 20-23 are schematic diagrams showing the use of buffers of the present invention to contain leakage current.
Figure 21:
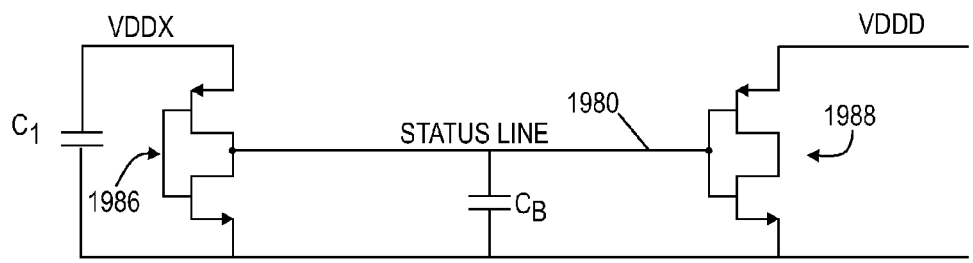

To help illustrate the function of the buffers, one embodiment of the buffers will be described. FIGS. 20 and 21 illustrate control and status lines without the benefit of the buffers of the present invention. FIG. 20 is a schematic diagram illustrating a control line 1878 connected between dynamic digital circuitry (the left side of FIG. 20) and static digital circuitry (the right side of FIG. 20). The control line 1878 is, as by example, connected at one end to an inverter 1886 and to an inverter 1888 at the other end. Capacitance $C_X$ is the capacitance between the control line 1878 and VDDX resulting from the proximity of the control line to VDDX or from the gate to source capacitance of the p-channel transistor of the inverter 1886. The supply filter capacitor C1 (see C1 in FIG. 6) will be bouncing due to activity in the dynamic circuitry, providing current to the control line 1878 through the capacitance $C_X$. If the control line 1878 is low, this current will flow through the driving n-channel transistor of inverter 1888 or through capacitance $C_A$ and return. This could result in a large current loop, which results in a large mutual inductance to a neighboring VCO. Worse yet, if the control line 1878 is high, the current will flow through $C_A$ and also through the driving p-channel transistor of the inverter 1888 to VDDD. This could result in an even larger current loop, i.e., possibly leading off the IC to a bypass capacitor.

In addition to the problems identified above, more problems may occur if the status or control lines are routed near or across other signal lines or supply lines inside that dynamic digital circuitry block. In such a case, the status or control lines may be capacitively coupled to the other signal lines or supply lines, thus providing an escape route for leakage current.

The status line 1980 shown in FIG. 21 is connected at one end to an inverter 1986 and to an inverter 1988 at the other end. If the status line is low, there is no problem with VDDX, but there may be problems with other signal routes (described above). If the status line is high, however, there is a direct connection to VDDX through the p-channel transistor of the inverter 1986 and current will flow from VDDX through route capacitance $C_B$ and also through the receiving gates of the inverter 1988 to VDDD. It can be seen that without buffers, such as buffers 1782 and 1784 (FIG. 19), high frequency current that might have otherwise been well localized to the dynamic circuitry and its filter is not contained and is allowed to flow outside the block of dynamic digital circuitry, resulting in a large loop area and a large mutual inductance.

Figure 22:
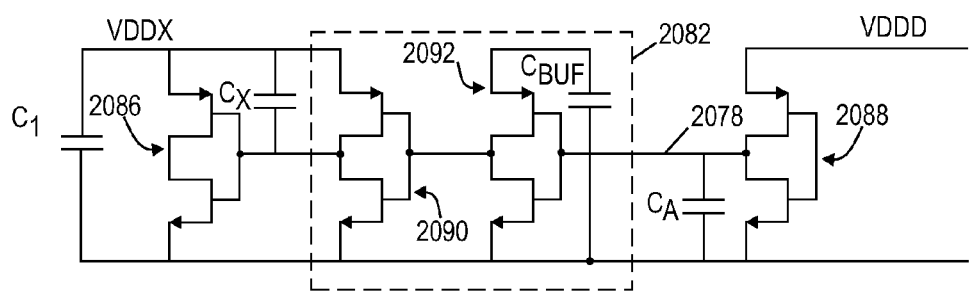
Figure 23:
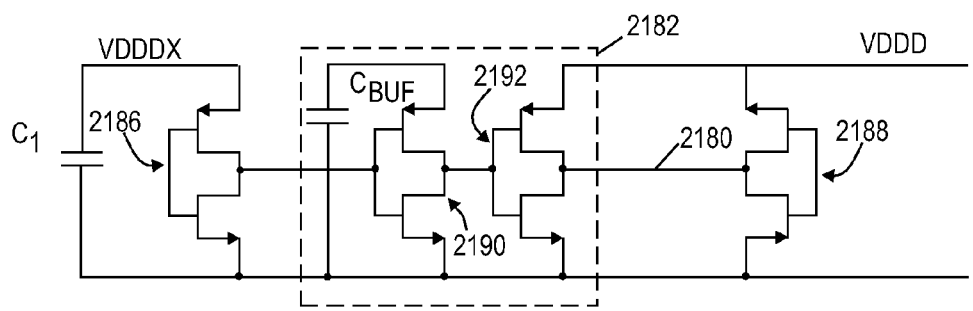

FIGS. 22 and 23 illustrate an embodiment of the buffers of the present invention applied to the circuits shown in FIGS. 20 and 21. FIG. 22 shows circuitry similar to that shown in FIG. 20, but with a buffer 2082 inserted on the control line 2078. The buffer 2082 is preferably physically located on the IC on the periphery of the dynamic digital circuitry. The buffer 2082 is comprised of a first inverter 2090 and a second inverter 2092. The first inverter 2090 is powered by VDDX while the second inverter 2092 is powered by a buffer filtering capacitor $C_{BUF}$ (through a filtering resistor (not shown)). With the buffer 2082 in place, high frequency current is confined within the dynamic digital circuitry (the left side of FIG. 22), and perhaps within the buffer filter, without effecting the reception of the static signal on the control line 2078.

FIG. 23 shows circuitry similar to that shown in FIG. 21, but with a buffer 2182 inserted on the status line 2180. The buffer 2182 is preferably physically located on the IC on the periphery of the dynamic digital circuitry. The buffer 2182 is comprised of a first inverter 2190 and a second inverter 2192. The second inverter 2192 is powered by VDDD while the first inverter 2190 is powered by a buffer filtering capacitor $C_{BUF}$ (through a filtering resistor (not shown)). With the buffer 2182 in place, high frequency current is confined within the dynamic digital circuitry (the left side of FIG. 23), and perhaps within the buffer filter, without effecting the transmission of the static signal on the status line 2180.

While FIGS. 22 and 23 show inverters 2092 and 2190 as being powered by buffer filtering capacitor $C_{BUF}$ (through a filtering resistor), these inverters could also be powered by VDDD and VDDX, respectively, although the isolation would be diminished. Also, while the buffers in FIGS. 22 and 23 are shown as inverters, other types of buffers could be used. Also, the "buffers" shown in FIGS. 19, 22, and 23 are not used in their conventional sense, that is, to bring a signal to an increased driving level. The buffers of the present invention are used for isolation purposes.

Figure 24:
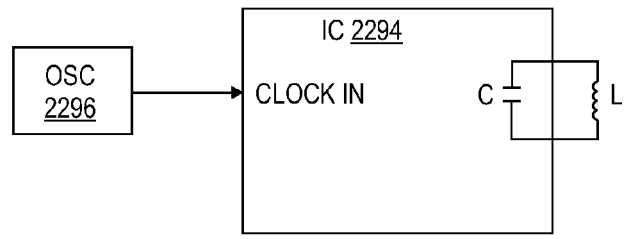
FIG. 24 is a block diagram showing an integrated circuit with an input clock signal.

The next technique described addresses the problem of spurs caused by changes in impedance during the operation of a circuit. The problem addressed here relates to an input clock signal which an IC receives from an external clock source. FIG. 24 is a block diagram showing an IC 2294 which receives a clock signal from an external oscillator 2296. FIG. 24 also shows the LC tank of a VCO which is mutually coupled to the input clock signal. Spurs may occur around the output frequency of the VCO at frequencies offset by the frequency of the input clock (e.g., 13 MHz on either side of the output frequency for an input clock signal at 13 MHz). The spurs are a result of the impedance changing at the clock input of the IC as the clock input voltage changes. Specifically, the impedance looking into a comparator at the clock input changes when the state of the comparator changes. In addition, electrostatic discharge (ESD) protection diodes have a capacitance which is dependent on the voltage level. In general, any voltage dependent impedance may contribute to spurs.

Figure 25:
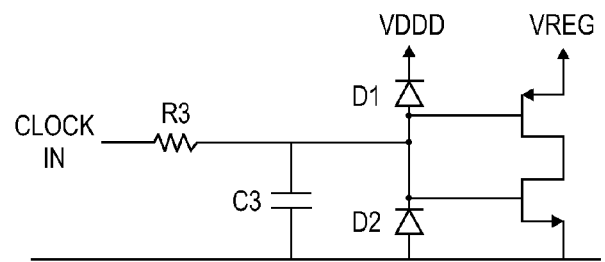
FIG. 25 is a schematic diagram of an RC filter for isolating the input clock signal of an integrated circuit.

FIG. 25 is a schematic diagram illustrating one technique that addresses this problem. FIG. 25 shows an RC filter inserted in the clock input line of the IC. The RC filter is comprised of a resistor R3 and a capacitor C3. As the values of R3 and C3 increase, the impedance looking into the IC at the VCO frequency is effected less by the changes in impedance mentioned above. Therefore, by carefully selecting values for R3 and C3, the RC filter effectively isolates the impedance changes from the VCO but allows the clock signal to pass through. In one embodiment, where the input clock is 13 MHz, and where the output frequency of the LC tank is 900 MHz, R3 is a 500Ω resistor and capacitor C3 is a 5 pF capacitor. Of course, other suitable values may be selected, depending on the situation. Note that the resistor R3 shown in FIG. 25 will not have ESD protection, so it must be sized accordingly. Therefore, the resistor R3 may take up a lot of area on the IC.

Note that similar RC filters could be used on other inputs or outputs of the IC, not just on clock inputs. The filters may be used on any interface pin (e.g., input and/or output) of a circuit. Also note that the filter could be comprised of an LC filter rather than an RC filter. In another embodiment, an external resistor or inductor can be used in place of the resistor R3 which is formed on the IC.

Figure 26:
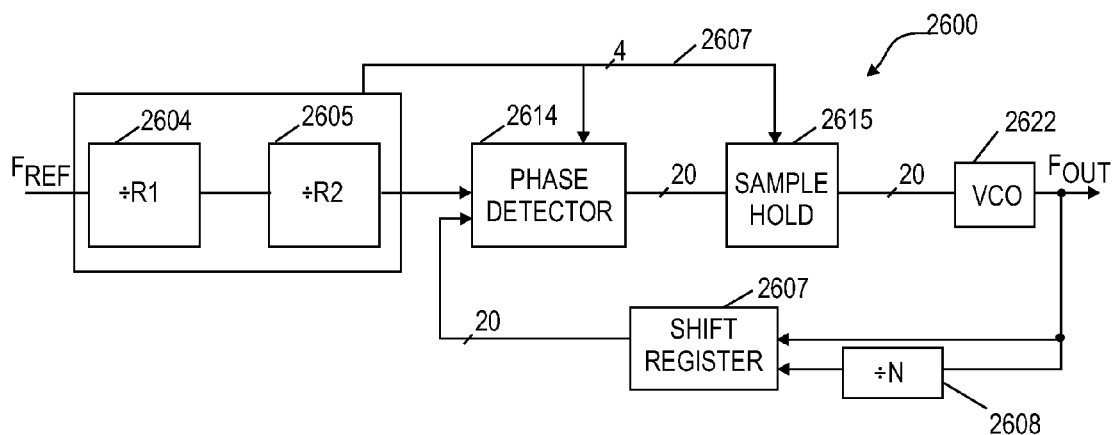
FIG. 26 is a block diagram of a frequency synthesizer of the present invention.

FIG. 26 is a block diagram illustrating another example of circuitry with which the present invention may be used. FIG. 26 illustrates a frequency synthesizer utilizing a digital and analog VCO implementation which provides an alternative to the circuit shown in FIG. 4. A PLL 2600 is formed in which the phase detector, charge pump, and loop filter (see FIG. 4) are replaced with a shift register 2607, phase detector 2614, and sample hold circuit 2615. The shift register 2607 has 20 outputs which are connected to the 21 inputs of the phase detector 2614. The phase detector 2614 has 20 outputs which are connected to the 20 inputs of the sample and hold 2615. Each of the techniques described above may be applied to the circuit shown in FIG. 26, as well as any other desired circuits.

The circuit shown in FIG. 26 is described in detail in commonly owned, co-pending patent application Ser. No. 09/087,485, filed on May 29, 1998, and entitled "METHOD AND APPARATUS FOR GENERATING VARIABLE CAPACITANCE FOR SYNTHESIZING HIGH-FREQUENCY SIGNALS FOR WIRELESS COMMUNICATIONS", which is incorporated by reference herein.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method, comprising:
   forming circuitry within an integrated circuit (IC) comprising radio-frequency (RF) circuitry,
      wherein an impedance of the formed circuitry changes state over time during an operation of the formed circuitry; and
   creating replica circuitry of the formed circuitry, the replica circuitry adapted to have a state opposite of a state of the formed circuitry if operated,
   wherein the formed circuitry and the replica circuitry are formed as mirror images of each other, and wherein the formed circuitry and the replica circuitry are driven by digital circuitry that receives power via a filter that reduces a mutual inductance with the RF circuitry.

2. The method according to claim 1, wherein the formed circuitry comprises a first inverter.

3. The method according to claim 1, wherein the replica circuitry comprises a second inverter.

4. The method according to claim 3, wherein second inverter is controlled to be in an opposite state of the first inverter.

5. The method according to claim 1, wherein a sole function of the replica circuitry comprised reducing interference.

6. The method according to claim 1, further comprising forming an inverter coupled between an input of the formed circuitry and an input of the replica circuitry.

7. The method according to claim 1, wherein the integrated circuit (IC) comprises phase locked loop (PLL) circuitry.

8. The method according to claim 7, wherein the phase locked loop (PLL) circuitry comprises voltage controlled oscillator (VCO) circuitry.

9. The method according to claim 8, wherein the voltage controlled oscillator (VCO) circuitry generates a radio-frequency (RF) signal.

10. A method, comprising:
    forming circuitry within an integrated circuit (IC) comprising analog circuitry and digital circuitry, wherein an impedance of the formed circuitry changes state over time during an operation of the formed circuitry;
    creating replica circuitry of the identified circuitry within the integrated circuit (IC), wherein the replica circuitry is adapted to operate in a state opposite of a corresponding state of the formed circuitry when the integrated circuit is operated, and wherein the formed circuitry and the replica circuitry are formed as mirror images of each other; and
    forming an inverter within the integrated circuit (IC), wherein the inverter couples an input of the formed circuitry to an input of the replica circuitry, and wherein the inverter is driven by a digital circuit that receives power via a filter that reduces a mutual inductance with the analog circuitry within the IC.

11. The method according to claim 10, wherein the replica circuitry has no function in the circuit other than reducing interference within the integrated circuit (IC).

12. The method according to claim 10, wherein the formed circuitry is at least in part within the digital circuitry of the integrated circuit (IC).

13. The method according to claim 10, wherein the formed circuitry is at least in part within the analog circuitry of the integrated circuit (IC).

14. The method according to claim 10, wherein the formed circuitry is at least in part within phase locked loop (PLL) circuitry in the integrated circuitry (IC).

15. The method according to claim 10, wherein the phase locked loop (PLL) circuitry generates a radio-frequency (RF) signal used to operate radio-frequency (RF) apparatus.

16. A method of reducing interference in an integrated circuit (IC), the method comprising:
    forming circuitry within the integrated circuit (IC), wherein an impedance of the formed circuitry changes state over time if the formed circuitry is operated; and
    forming replica circuitry of the identified circuitry within the integrated circuit (IC), wherein the replica circuitry is adapted to have an operating state opposite of a corresponding state of the formed circuitry, and wherein the formed circuitry and the replica circuitry are formed as mirror images of each other,
    wherein the formed circuitry and the replica circuitry are driven by digital circuitry powered via a supply filter that reduces a mutual inductance with analog circuitry within the IC.

17. The method according to claim 16, wherein the formed circuitry comprises a first inverter.

18. The method according to claim 16, wherein the replica circuitry comprises a second inverter.

19. The method according to claim 16, wherein the formed circuitry comprises a first signal line formed within the integrated circuitry (IC).

20. The method according to claim 16, wherein the formed circuitry comprises a second signal line formed within the integrated circuitry (IC).

* * * * *